United States Patent
Otsuka

(10) Patent No.: US 7,495,588 B2
(45) Date of Patent: Feb. 24, 2009

(54) DECODING APPARATUS AND DECODING METHOD

(75) Inventor: Katsumi Otsuka, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/927,926

(22) Filed: Oct. 30, 2007

(65) Prior Publication Data

US 2008/0100480 A1    May 1, 2008

(30) Foreign Application Priority Data

Nov. 1, 2006  (JP)  ............................. 2006-298210

(51) Int. Cl.
*H03M 7/00* (2006.01)

(52) U.S. Cl. ..................... 341/107; 341/50; 341/51; 341/65; 714/767

(58) Field of Classification Search ............... 341/107, 341/50, 51, 65; 714/767
See application file for complete search history.

(56) References Cited

U.S. PATENT DOCUMENTS

| 6,557,137 B1 | 4/2003 | Park et al. | |
| 6,940,429 B2 * | 9/2005 | Sankaran | 341/65 |
| 2004/0117714 A1 * | 6/2004 | Marpe et al. | 714/767 |
| 2006/0017591 A1 * | 1/2006 | Bossen | 341/50 |

FOREIGN PATENT DOCUMENTS

| JP | 11-103257 | 4/1999 |
| JP | 2005-130099 | 5/2005 |

OTHER PUBLICATIONS

The above reference was cited in an Oct. 31, 2008 US Office Action that issued in related U.S. Appl. No. 11/927,892, a copy of which is enclosed.
U.S. Appl. No. 11/927,892, filed Oct. 30, 2007, Katsumi Otsuka.
Series H: Audiovisual and Mutlimedia Systems; Infrastructure of Audiovisual Services—Coding of moving video: Advanced video coding for generic audiovisual services, ITU-T Recommendation H.264 | ISO/IEC 14496-10 AVC, approved Mar. 2005 http://www.itu.int/rec/T-REC-H.264/en.
Series H: Audiovisual and Mutlimedia Systems; Infrastructure of Audiovisual Services—Coding of moving video: Reference software for H.264 advanced video coding, H.264 Reference Software Joint Model ver9.0, approved Mar. 2005 http://www.itu.int/rec/T-REC-H.264.2/en.

* cited by examiner

*Primary Examiner*—Jean B Jeanglaude
(74) *Attorney, Agent, or Firm*—Cowen, Liebowitz & Latman, P.C.

(57) ABSTRACT

A decoding apparatus includes a state variable calculation unit which calculates a second state variable based on a first context variable and a first state variable which are stored in a first memory unit and a second memory unit, respectively, and determines a selection signal representing a symbol as a result of arithmetic decoding processing. A context variable calculation unit calculates a second context variable based on the first context variable and the selection signal and updates the first memory unit. A re-normalization unit calculates a third state variable by using the coded data and the second state variable and updates the second memory unit. The state variable calculation unit outputs the determined selection signal that is usable in processing of a succeeding step without waiting for the operations of the context variable calculation unit and the re-normalization unit.

15 Claims, 15 Drawing Sheets

FIG. 6

| codIRange | SHIFT AMOUNT (BITS) |
|---|---|
| 1_XXXX_XXXX | 0 |
| 0_1XXX_XXXX | 1 |
| 0_01XX_XXXX | 2 |
| 0_001X_XXXX | 3 |
| 0_0001_XXXX | 4 |
| 0_0000_1XXX | 5 |
| 0_0000_01XX | 6 |
| 0_0000_001X | 7 |
| 0_0000_0001 | 8 |

FIG. 7

| SHIFT AMOUNT (BITS) | EXTRACTED CODED DATA |
|---|---|
| 0 | "0_0000_0000" |
| 1 | "0000_0000" & Cin [7] |
| 2 | "0000_000" & Cin [7:6] |
| 3 | "0000_00" & Cin [7:5] |
| 4 | "0000_0" & Cin [7:4] |
| 5 | "0000" & Cin [7:3] |
| 6 | "000" & Cin [7:2] |
| 7 | "00" & Cin [7:1] |
| 8 | "0" & Cin [7:0] |

FIG. 11

```
unsigned int unary_exp_golomb_level_decode
(DecodingEnvironmentPtr dep_dp,
 BiContext TypePtr ctx)
{
  unsigned int l, k;
  unsigned int symbol;
  unsigned int exp_start=13;

symbol=biari_decode_symbol (dep_dp, ctx);
  if (symbol==0)
    return 0;
  else
  {
    symbol=0;
    k=1;
    do
    {
      l=biari_decode_symbol (dep_dp, ctx);
      symbol++;
      k++;
    }
    while (((l!=0) && (k!=exp_start));
    if (l!=0)
      symbol+=exp_golomb_decode_eq_prob (dep_dp, 0)+1;
    return symbol;
  }
}
```

```
unsigned int exp_golomb_decode_eq_prob
(DecodingEnvironmentPtr dep_dp,
 int k)
{
  unsigned int l;
  int symbol=0;
  int binary_symbol=0;

do
  {
    l=biari_decode_symbol_eq_prob (dep_dp);
    if (l==1)
    {
      symbol+= (1<<k);
      k++;
    }
  } while (l!=0);

while (k--)                              //next binary part
    if (biari_decode_symbol_eq_prob (dep_dp)==1)
      binary_symbol |= (1<<k);

return (unsigned int) (symbol binary+symbol);
}
```

FIG. 12

| coef_abs_level_minus 1 | UT | Golomb |
|---|---|---|
| 0 | 0 | |
| 1 | 1 0 | |
| 2 | 1 1 0 | |
| 3 | 1 1 1 0 | |
| 4 | 1 1 1 1 0 | |
| .... | .... | .... |
| 12 | 1 1 1 1 1 1 1 1 1 1 1 0 | |
| 13 | 1 1 1 1 1 1 1 1 1 1 1 1 0 | |
| 14 | 1 1 1 1 1 1 1 1 1 1 1 1 1 | 0 |
| 15 | 1 1 1 1 1 1 1 1 1 1 1 1 1 | 1 0 0 |
| 16 | 1 1 1 1 1 1 1 1 1 1 1 1 1 | 1 0 1 |
| 17 | 1 1 1 1 1 1 1 1 1 1 1 1 1 | 1 1 0 0 0 |
| .... | .... | .... |

DECODING APPARATUS AND DECODING METHOD

BACKGROUND OF THE INVENTION

1. Field of the Invention

The present invention relates to a decoding apparatus and decoding method. The present invention particularly relates to speedup of entropy coding/decoding processing as a compression scheme used to encode a moving image or still image. The present invention is particularly suitable for arithmetic decoding processing as an entropy decoding method.

2. Description of the Related Art

Recently, the H.264 (ITU-T Rec.H.264|ISO/IEC 14496-10 AVC) coding scheme has been standardized in joint video team (JVT). The H.264 handles image information as digital data, like JPEG known as a still image coding scheme and MPEG-2 or MPEG-4 (version 2) known as a moving image coding scheme. Especially in the moving image coding scheme, compression using hybrid coding is executed to reduce redundant information between frames (in the temporal direction) and redundant information of pixels in a frame (in the spatial direction), aiming at efficient information transmission and storage. This hybrid coding uses entropy coding together with orthogonal transform such as discrete cosine transform and motion-compensation. Entropy coding is a technique of executing variable length coding using uneven distribution of information.

As entropy coding used in the H.264, Context-based Adaptive Variable Length Coding (CAVLC) using Huffman coding or Context-Adaptive Binary Arithmetic Coding (CABAC) using arithmetic coding is defined in accordance with the profile. CAVLC is selected in a baseline profile which includes coding tools with low process complexity for a communication application. CABAC is selected in a main profile or high profile that places focus on the coding efficiency.

Generally, a technical difficulty in speeding up arithmetic coding such as CABAC is final symbol determination. FIG. 10 is a flowchart of CABAC decoding processing described in, for example, the H.264 recommendation (ITU-T Rec.H.264|ISO/IEC 14496-10 AVC). A detailed description of the flowchart in FIG. 10 will be omitted. In step S204, Binarization(SE) to binarize a syntax element SE is activated. This process is executed for comparison with binary data in final symbol determination in step S209.

In the processing shown in FIG. 10, arithmetic decoding processing is executed in step S208. In step S208, DecodeBin (ctxIdx) as arithmetic decoding processing is executed to obtain symbol data. In step S209, it is determined whether the symbol data obtained in step S208 exists in the binary data obtained by the binarization in step S204, thereby determining whether the symbol data is the final symbol of the syntax element SE. More specifically, in step S209, it is determined whether the result of DecodeBin(ctxIdx) decoded for every symbol exists in an enormous number of combinations of symbols obtained by binarizing all values that the syntax element SE as the decoding target can take in advance. It is then determined based on the determination result whether the symbol data is the final symbol of the syntax element SE.

However, it is obviously technically difficult to implement the processing flow by software or hardware.

FIG. 11 shows the decoding program of CABAC processing of coef_abs_level_minus1 implemented in Joint Model that is known as H.264 Reference Software. FIG. 12 shows a result of binarization by concatenated unary/kth order exp-Golomb coding in coef_abs_level_minus1. As is apparent from FIG. 12, when the final symbol of the binarized symbol data string has a value of 14 or less, unary coding is applied, and the data string always ends with 0. When the value is larger than 14, Golomb coding is applied, and the data string includes a prefix and a suffix with a value "0" placed at the boundary between them. As is apparent from FIG. 11, in Joint Model, the final symbol is determined by using the symbol appearance characteristic of concatenated unary/kth order exp-Golomb coding.

FIG. 13 is a block diagram showing the hardware configuration of CABAC processing using the Joint Model technology. FIG. 14 shows arithmetic decoding processing executed by an arithmetic decoding unit 501 disclosed in "H.264 Reference Software Joint Model ver9.0". FIG. 15 shows re-normalization processing executed by a re-normalization unit 502. Note that DecodeBin(ctxIdx) includes DecodeDecision (ctxIdx) as arithmetic coding and DecodeBypass (not shown) as fixed length encoding. The simple DecodeBypass processing is omitted here.

Along with the recent rapid increase in the resolution represented by high-resolution images, a demand for coding and decoding apparatuses capable of high-speed processing has arisen. In hybrid coding represented by H.264, in particular, a factor that determines the processing speed of an entire decoding apparatus is speedup of an entropy decoding apparatus.

However, it is technically difficult to implement the decoding processing (FIG. 10) in the above-described "ITU-T Rec.H.264|ISO/IEC 14496-10 AVC". When the decoding processing described in "H.264 Reference Software Joint Model ver9.0" is implemented by hardware, a feedback loop containing an enormous number of logics via a context memory 503 are present. Additionally, a symbol is input to a final symbol determination unit 504 after all processes shown in FIGS. 14 and 15 finish. It is therefore difficult to implement hardware for decoding one symbol in one cycle.

SUMMARY OF THE INVENTION

The present invention has been made in consideration of the above-described problems, and has as its object to enable high-speed entropy decoding processing.

According to one aspect of the present invention, there is provided a decoding apparatus for executing arithmetic decoding of input coded data by using a state variable representing a state of arithmetic decoding processing and a context variable representing a probability state of a symbol, comprising:

a first memory unit which holds a first context variable;

a second memory unit which holds a first state variable;

a state variable calculation unit which calculates a second state variable based on the first context variable and the first state variable and determines a selection signal representing a symbol as a result of arithmetic decoding processing;

a context variable calculation unit which calculates a second context variable based on the first context variable and the selection signal and updates contents of the first memory unit by the second context variable; and a re-normalization unit which calculates a third state variable by using the coded data and the second state variable and updates contents of the second memory unit by the third state variable, wherein the selection signal determined by the state variable calculation unit is used in processing of a succeeding stage without waiting for operations of the context variable calculation unit and the re-normalization unit.

Further features of the present invention will become apparent from the following description of exemplary embodiments with reference to the attached drawings.

BRIEF DESCRIPTION OF THE DRAWINGS

FIG. 6 is a table for explaining the processing of a shift amount detector 1101 according to the embodiment;

FIG. 7 is a table for explaining coded data extraction processing corresponding to a shift amount;

FIG. 11 is view showing the source code of CABAC processing by H.264 Reference Software;

FIG. 12 is a view showing an example of concatenated unary/kth order exp-Golomb coding processing;

DESCRIPTION OF THE EMBODIMENTS

Preferred embodiments of the present invention will now be described in detail in accordance with the accompanying drawings.

Figure 1:
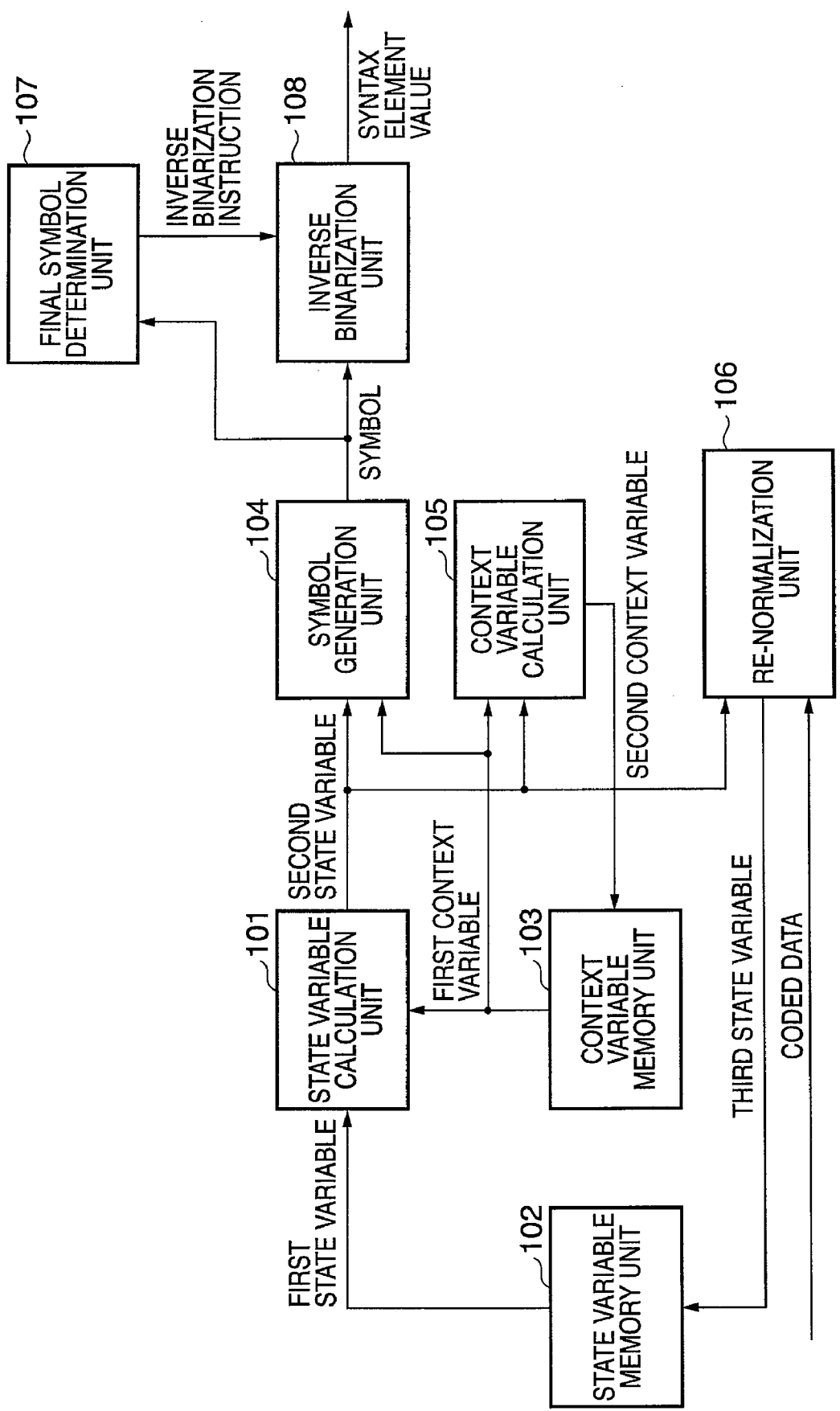
FIG. 1 is a block diagram showing an arrangement example of an entropy decoding apparatus (arithmetic decoding apparatus) according to an embodiment.
Figure 10:
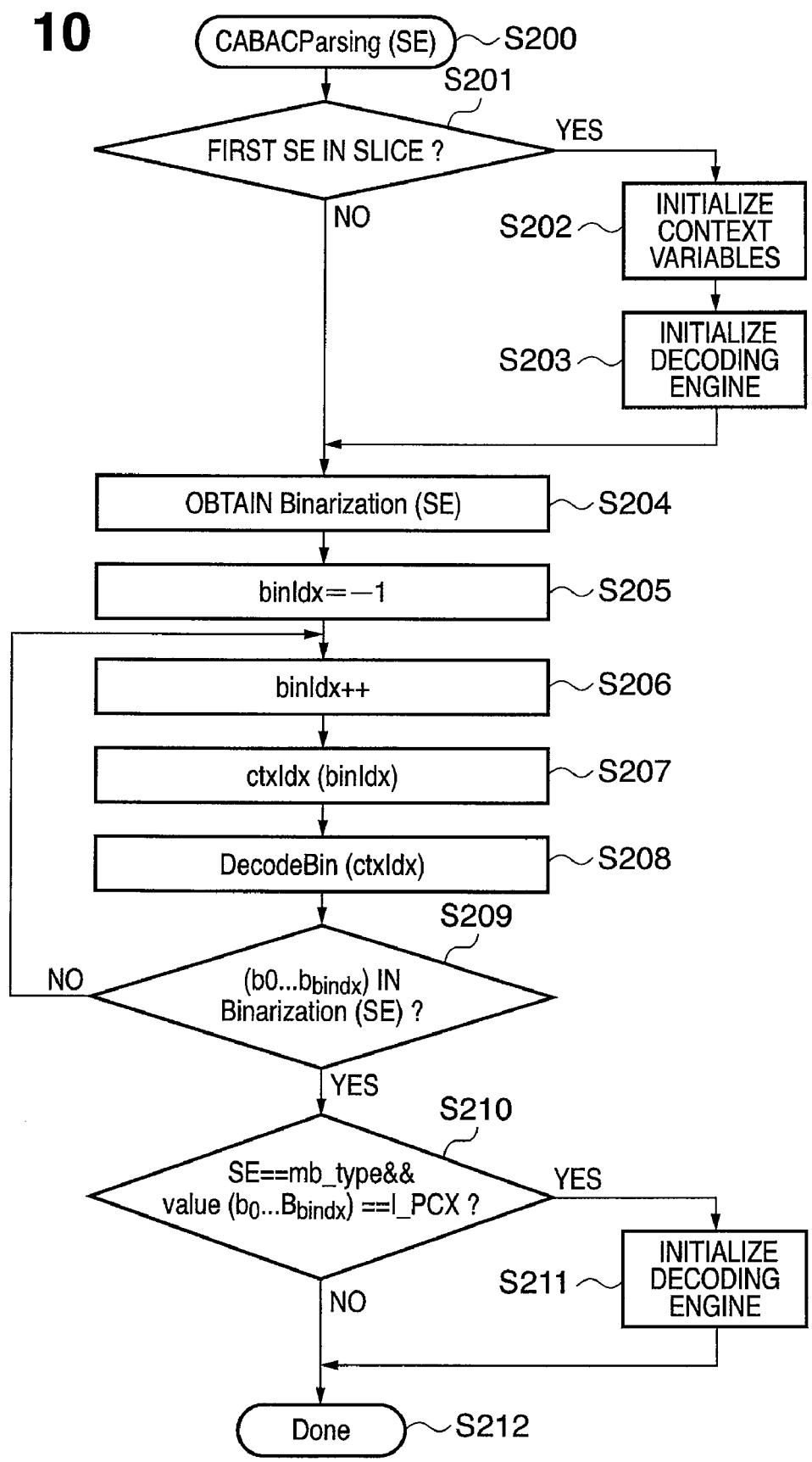
FIG. 10 is a flowchart illustrating CABAC decoding processing CABACParsing( )
Figure 13:
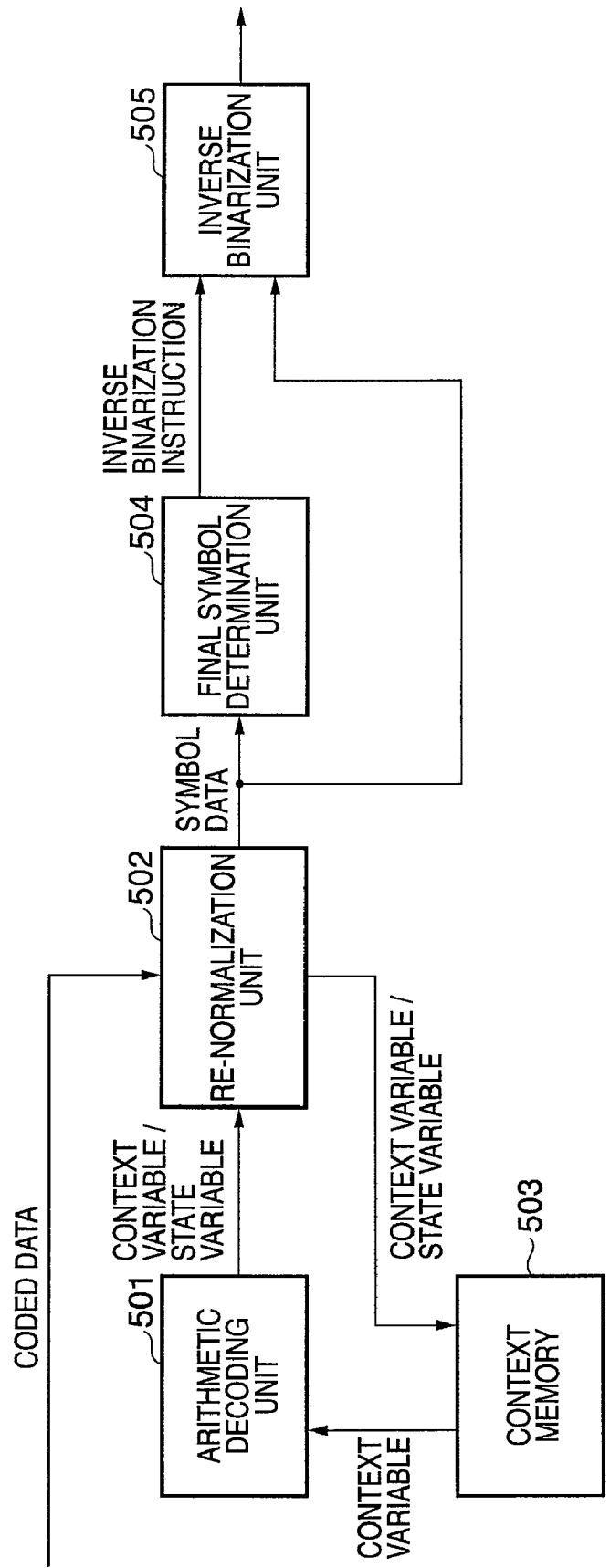
FIG. 13 is a block diagram for explaining the hardware configuration of CABAC processing by H.264 Reference Software.

FIG. 1 is a block diagram showing an arrangement example of an entropy decoding apparatus (arithmetic decoding apparatus) according to the embodiment. The entropy decoding apparatus of this embodiment decodes coded data obtained by CABAC coding as an entropy coding method based on H.264. Units 101 to 106 in FIG. 1 execute the decoding processing in step S208 of FIG. 10. A final symbol determination unit 107 executes the processing in step S209.

The context variable memory unit 103 stores a value MPS of a most probable symbol as a context variable corresponding to all context indices defined in the H.264 recommendation (ITU-T Rec.H.264|ISO/IEC 14496-10 AVC) and pStateIdx representing a probability state. In this embodiment, coded data is binary data, and the most probable symbol represents 0 or 1. The context variables output from the context variable memory unit 103 will be referred to as first context variables. The state variable memory unit 102 stores codIrange and codIOffset as decoding engine state variables.

The decoding engine state variables output from the state variable memory unit 102 will be referred to as first state variables.

The state variable calculation unit 101 receives the first context variables (MPS and pStateIdx) and first state variables (codIRange and codIOffset) and calculates second state variables (codIRange' and codIOffset'). The state variable calculation unit 101 also calculates, based on the first context variable and first state variable, a symbol selection signal (MPSorNot) representing whether the symbol data of the decoding result is a most probable symbol. The first context variables are MPS and pStateIdx. The first state variables are codIRange and codIOffset. The symbol selection signal is MPSorNot.

Figure 2:
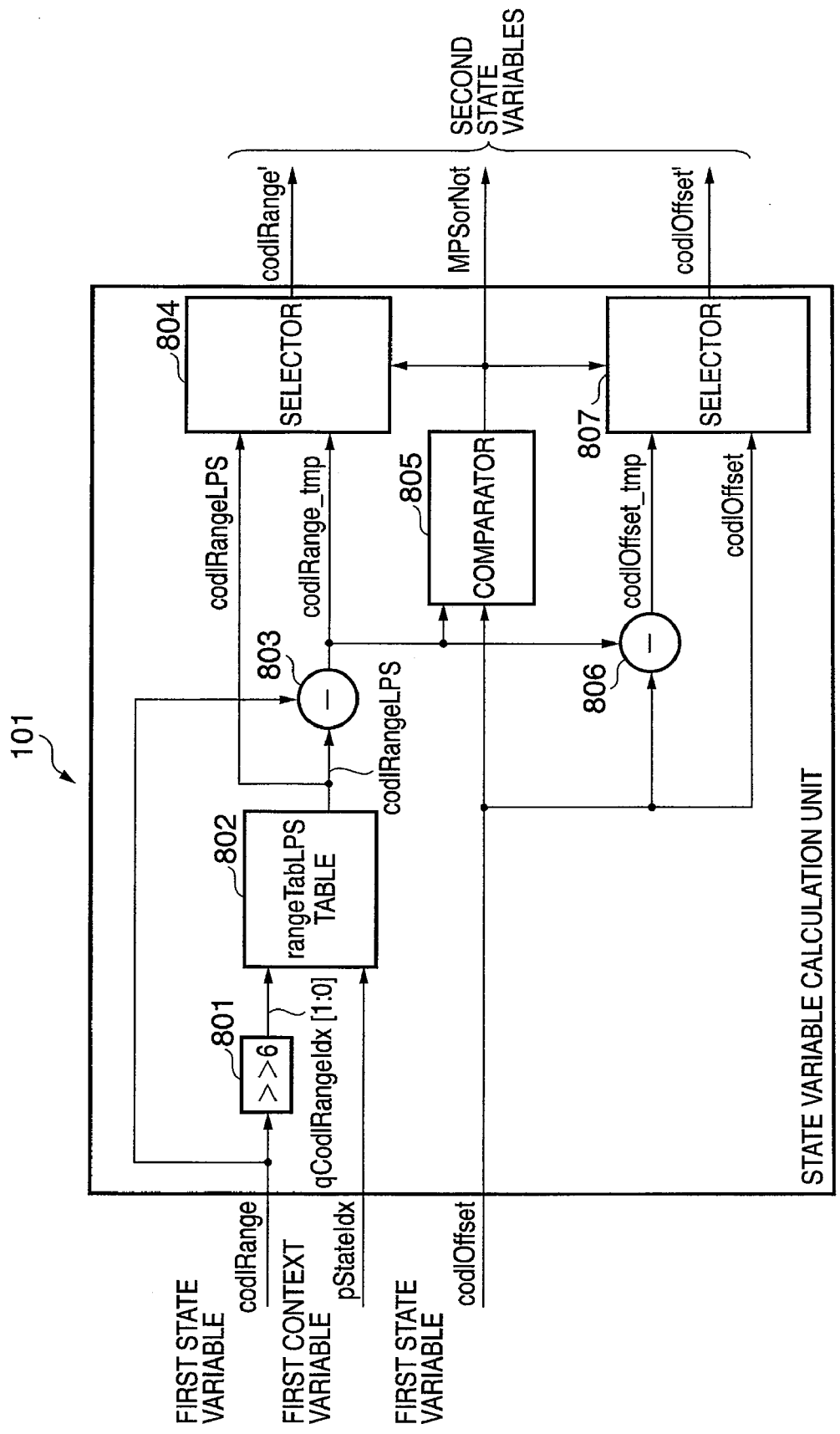
FIG. 2 is a block diagram showing the internal arrangement of a state variable calculation unit 101 according to the embodiment.

FIG. 2 is a block diagram showing the internal arrangement of the state variable calculation unit 101 according to the embodiment. A shifter 801 shifts, of the received first state variables, the codIRange to the right by six bits and outputs two lower bits. The 2-bit signal output from the shifter 801 is used as an index of a rangeTabLPS table 802, together with the pStateIdx of the first context variables. The bit length of the index of the rangeTabLPS table 802 is 8 [bits] as a sum of pStateIdx[5:0] and qCodIRangeIdx[1:0]. The rangeTabLPS table 802 outputs, as codIRangeLPS, an integer value ranging from 2 to 240 corresponding to the received index. A subtractor 803 subtracts the codIRangeLPS from the codIRange contained in the received first state variables to generate codIRange_tmp (codIRange−codIRangeLPS). The above-described processing corresponds to step S602 in FIG. 14.

A subtractor 806 subtracts the codIRangeLPS from the other state variable, that is, codIOffset to generate codIOffset_tmp (codIOffset_tmp=codIOffset−codIRangeLPS).

Figure 14:
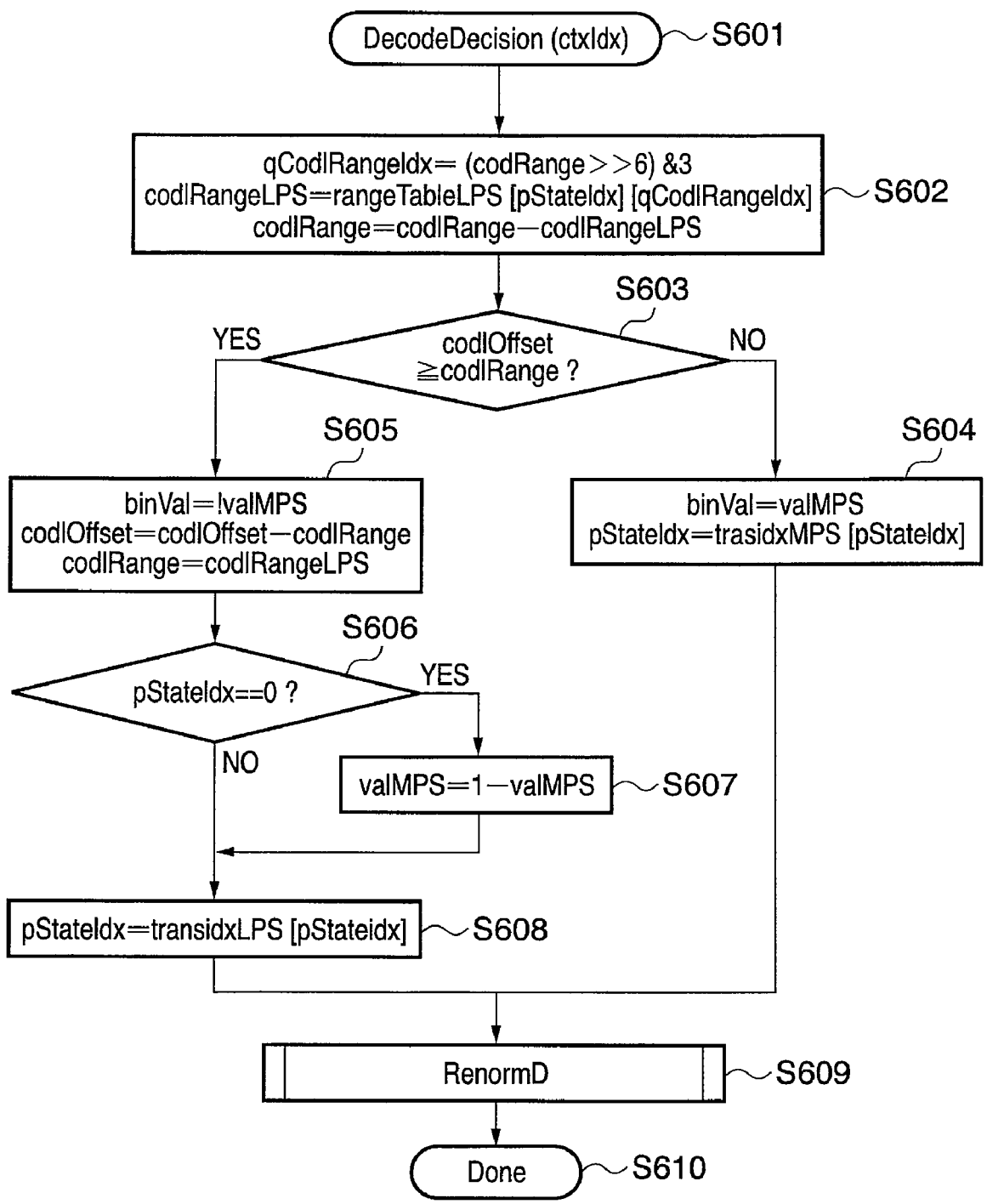
FIG. 14 is a flowchart of DecodeDecision( ) in the CABAC decoding processing.

A comparator 805 executes processing corresponding to the comparison operation in step S603 of FIG. 14. The comparator 805 compares codIOffset with codIRange_tmp. If codIOffset<codIRange_tmp, the comparator 805 outputs an MPSorNot signal representing selection of a most probable symbol. If codIOffset≧codIRange_tmp, the comparator 805 outputs an MPSorNot signal representing non-selection of a most probable symbol. That is, an MPSorNot signal represents whether a symbol is an MPS or not.

The MPSorNot signal from the comparator 805 is output to selectors 804 and 807. The selectors 804 and 807 output a second state variable based on the MPSorNot signal. More specifically, if the MPSorNot signal represents an MPS, the selector 804 outputs codIRange_tmp as a second state variable codIRange'. At this time, the selector 807 outputs the first state variable codIOffset as a second state variable codIOffset'. On the other hand, if the MPSorNot signal does not represent an MPS, the selector 804 outputs codIRangeLPS as the second state variable codIrange'. At this time, the selector 807 outputs codIOffset_tmp as the second state variable codIOffset'. The above-described processing corresponds to steps S603, part of step S605, and part of step S604 in FIG. 14.

Figure 3:
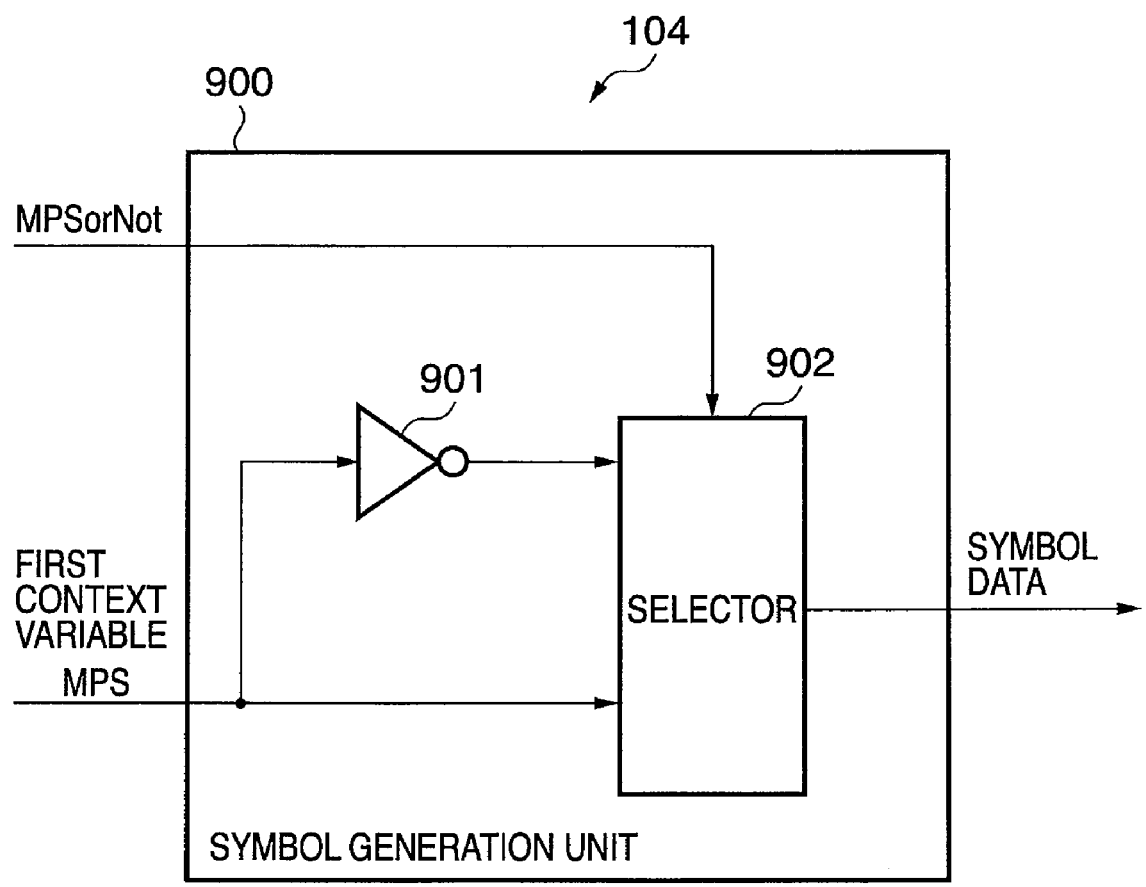
FIG. 3 is a block diagram showing the internal arrangement of a symbol generation unit 104 according to the embodiment.

FIG. 3 is a block diagram showing the internal arrangement of the symbol generation unit 104. The symbol generation unit 104 receives the MPS of the first context variables input from the context variable memory unit 103 and the MPSorNot signal from the state variable calculation unit 101 and outputs symbol data. More specifically, a selector 902 receives the input MPS signal and a signal obtained by inverting the logic of the received MPS by an inverter 901. The selector 902 selects one of the input signals based on the MPSorNot signal. If the MPSorNot signal represents selection of the MPS, the selector 902 outputs the received MPS signal as symbol data. If the MPSorNot signal represents non-selection of the MPS, the selector 902 outputs the inverted MPS signal as symbol data. The processing of the symbol generation unit 104 corresponds to binVAl determination in step S604 or S605 in FIG. 14.

Figure 4:
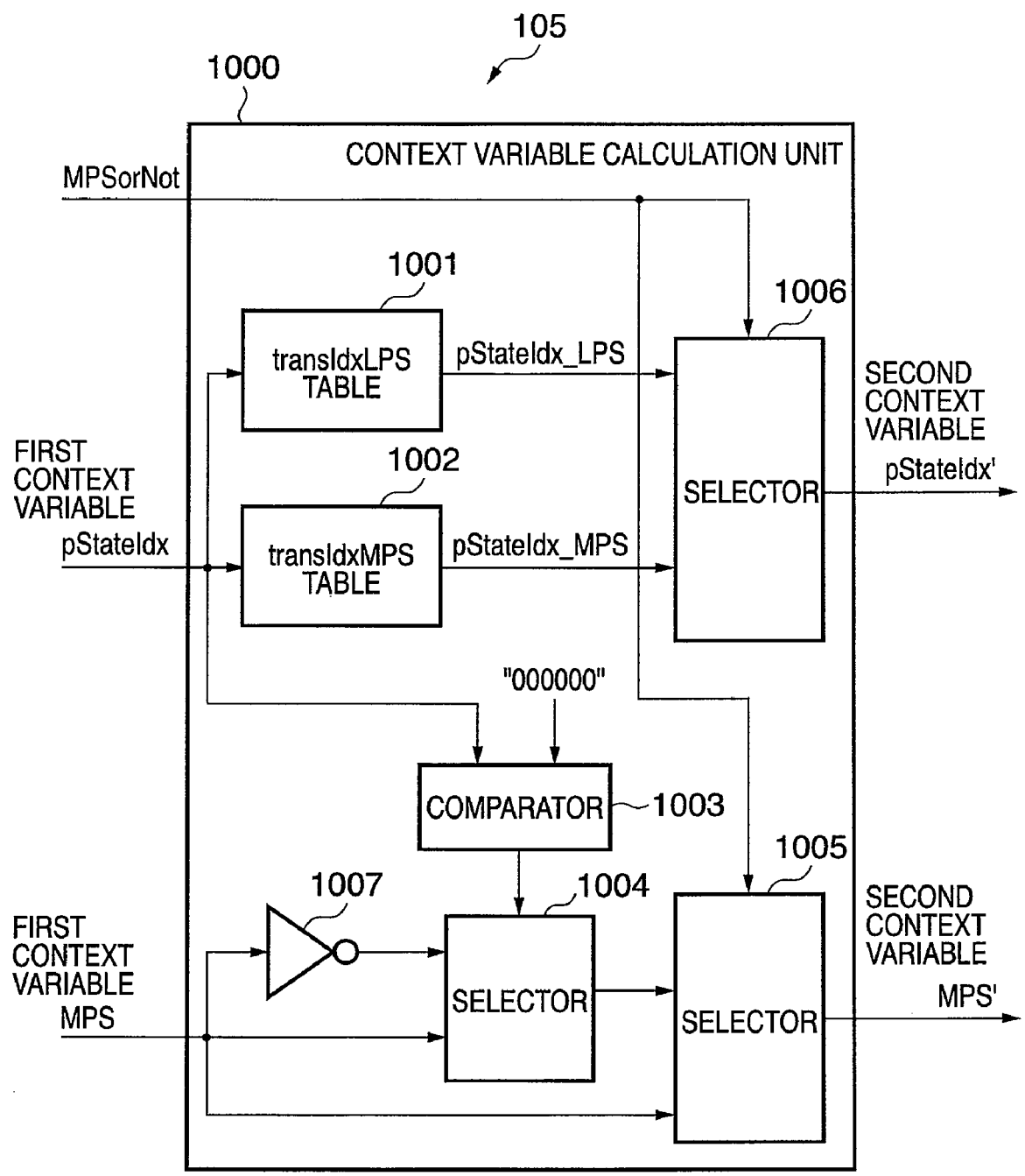
FIG. 4 is a block diagram showing the internal arrangement of a context variable calculation unit 105 according to the embodiment.

FIG. 4 is a block diagram showing the internal arrangement of the context variable calculation unit 105 according to the embodiment. Units except selectors 1006 and 1005 operate in parallel to the state variable calculation unit 101 because they do not use the processing result of the state variable calculation unit 101. In addition, the symbol generation unit 104 and context variable calculation unit 105 operate in parallel.

Using, as an index, the 6-bit value of the first context variable pStateIdx received from the context variable memory unit 103, a transIdxLPS table 1001 and transIdxMPS table 1002 are looked up in parallel. As a result, two candidate values pStateIdx_LPS and pStateIdx_MPS representing the next probability state of the pStateIdx are input to the selector 1006. For the other context variable MPS, a comparator 1003 compares the received pStateIdx with "000000". In accordance with the result output from the comparator 1003, a selector 1004 selects one of the received MPS and a value obtained by inverting the logic of MPS. More specifically, if the comparison result of the comparator 1003 represents coincidence (if pStateIdx=0 in step S606 of FIG. 14), the selector 1004 outputs the value obtained by inverting the logic of the received MPS. On the other hand, if the comparison result of the comparator 1003 represents incoincidence, the selector 1004 directly outputs the received MPS.

Each of the selectors 1005 and 1006 selects one of the two input signals based on the MPSorNot signal received from the state variable calculation unit 101. In this way, the context variable calculation unit 105 outputs second context variables pStateIdx' and MPS' and stores them in the context variable memory unit 103. More specifically, if the MPSorNot signal represents selection of the MPS, the selector 1006 outputs pStateIdx_MPS, and the selector 1005 outputs the received MPS. If the MPSorNot signal represents non-selection of the MPS, the selector 1006 outputs pStateIdx_LPS, and the selector 1005 outputs the signal (MPS or inverted signal thereof) received from the selector 1004. The above-described processing corresponds to steps S604 and S606 to S608 in FIG. 14. The second context variables stored in the context variable memory unit 103 are used as the first context variables in the next decoding processing.

Figure 5:
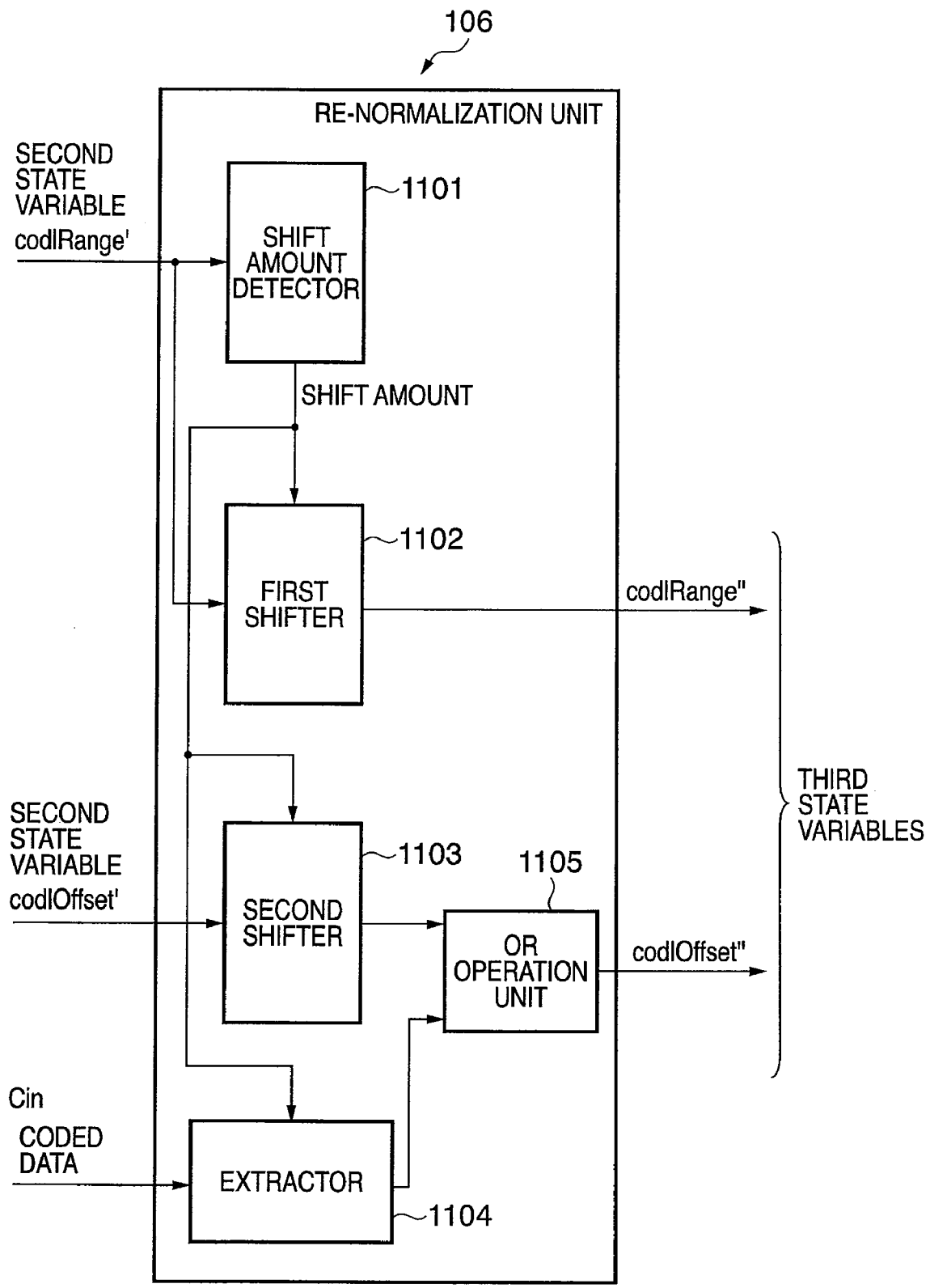
FIG. 5 is a block diagram showing the internal arrangement of a re-normalization unit 106 according to the embodiment.

FIG. 5 is a block diagram showing the internal arrangement of the re-normalization unit 106 according to the embodiment. The re-normalization unit 106 receives coded data (Cin) and the second state variables (codIRange' and codIOffset') output from the state variable calculation unit 101. A shift amount detector 1101 detects a shift amount by detecting a bit position where a bit value "1" appears for the first time from the MSB to LSB of the second state variable codlrange'. FIG. 6 is a table for explaining the processing of the shift amount detector 1101. The value of a bit expressed by X in the table can have either 0 or 1.

An extractor 1104 extracts bits in number designated by the shift amount output from the shift amount detector 1101 from the MSB side of the received coded data (Cin) and adds 0 to the left side to generate 9-bit data (extracted coded data). FIG. 7 is a table for explaining coded data extraction processing corresponding to a shift amount. Referring to FIG. 7, Cin[7:0] represents 8-bit data extracted from the MSB of the received coded data.

A first shifter 1102 shifts the data of codIRange' of the second state variables to the left by bits corresponding to the shift amount detected by the shift amount detector 1101 and outputs the result as a third state variable codIRange".

Figure 15:
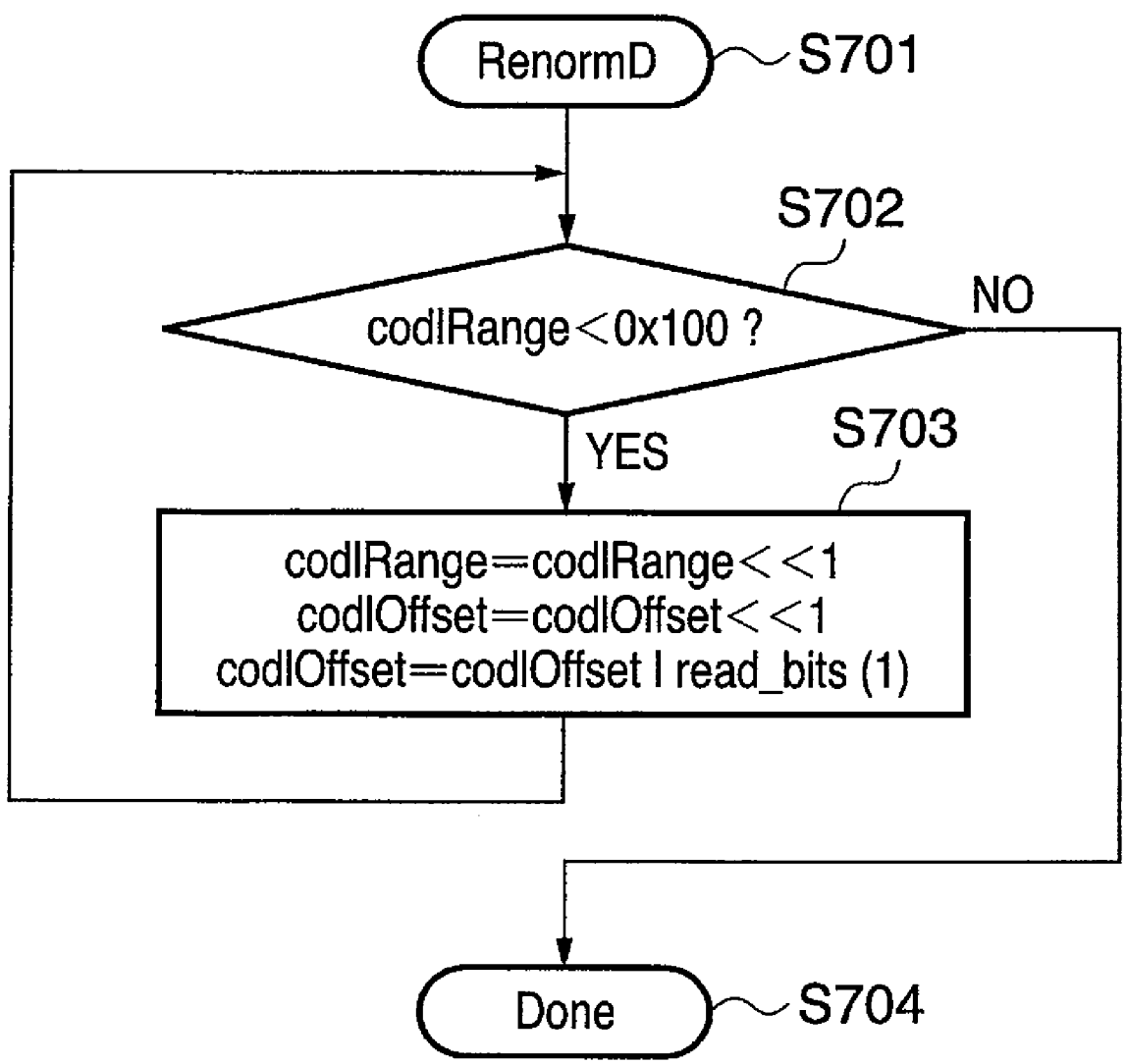
FIG. 15 is a flowchart of Renorm( ) in the CABAC decoding processing.

A second shifter 1103 shifts the data of codIOffset' of the second state variables to the left by bits corresponding to the shift amount detected by the shift amount detector 1101. An OR operation unit 1105 calculates the OR of the shift result (signal obtained by shifting codIOffset' to the left) from the second shifter 1103 and the extracted coded data from the extractor 1104 and outputs the result as a third state variable codIOffset". The re-normalization unit 106 stores, in the state variable memory unit 102, the third state variables obtained in the above-described way. The above-described processing corresponds to the loop processing of steps S702 and S703 shown in FIG. 15.

Figure 8:
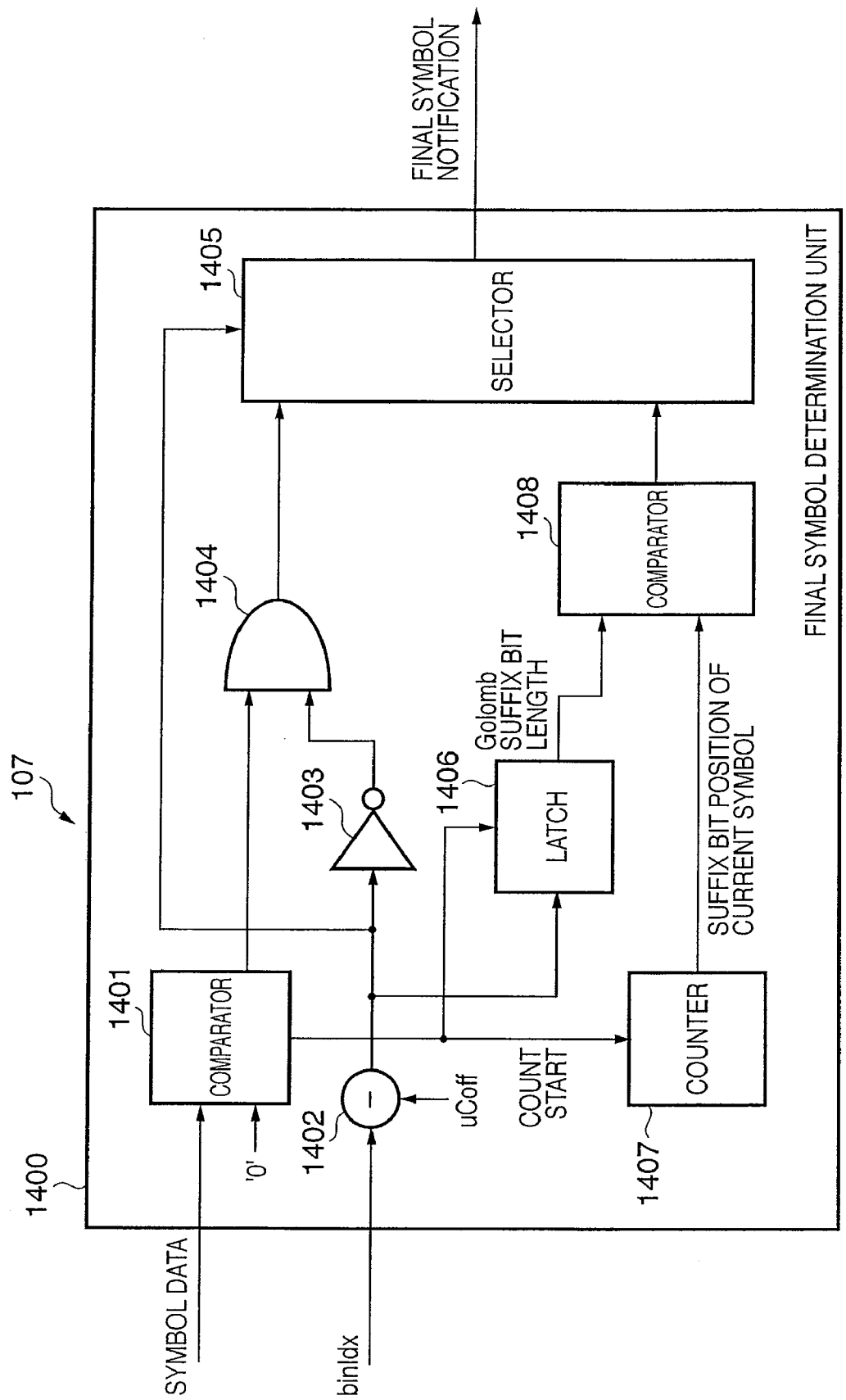
FIG. 8 is a block diagram showing the arrangement example of a final symbol determination unit 107 according to the embodiment.

FIG. 8 is a block diagram showing the arrangement example of the final symbol determination unit 107 according to the embodiment. In this embodiment, the target of the final symbol determination unit 107 is a syntax element binarized by concatenated unary/kth order exp-Golomb coding which can hardly determine the final symbol.

The final symbol determination unit 107 receives binIdx and symbol data output from the symbol generation unit 104 and determines the final symbol. Note that binIdx is a value representing the position of currently input symbol data from the top in a single syntax element, which is counted by an external counter (not shown).

A comparator 1401 compares a value "0" with the symbol data output from the symbol generation unit 104, thereby determining whether the symbol data is 0. On the other hand, a subtractor 1402 subtracts a constant uCoff from the binIdx. The constant uCoff is 15 when the syntax element is, for example, coef_abs_level_minus1. The constant uCoff is 10 when the syntax element is mvd__10[ ][ ][0], mvd__11[ ][ ][0], mvd__10[ ][ ][1], or mvd__11[ ][ ][1] expressing a motion vector. The value (code) of MSB obtained by the operation of the subtractor 1402 corresponds to a signal representing which code is used to binarize the current symbol data, unary code (MSB=0) or Golomb code (MSB=1). The value of MSB controls a selector 1405.

If the difference obtained by the subtractor 1402 is a positive value (MSB=0), the symbol data has been binarized by a unary code. In addition, If the comparator 1401 determines that the symbol data is 0, the final symbol determination unit 107 outputs a signal representing that the symbol data is final symbol data. More specifically, when the value of MSB equals to 0 (output of the subtractor 1402 is 0), the output signal from the inverter 1403 becomes 1 and the output signal is input to the AND gate 1404. Therefore, the AND gate 1404 outputs the comparison result signal from the comparator 1401. Thus, the comparison result signal from the comparator 1401 is input to the selector 1405 when the value of MSB equals to 0. Furthermore, the selector 1405 selects the output of the AND gate 1404 when the value of MSB equals to zero, and outputs the selected signal as the final symbol notification.

On the other hand, if the difference obtained by the subtractor 1402 is a negative value, the symbol data has been binarized by a Golomb code. In this case, a latch 1406 latches the value of the difference in the cycle of the symbol data, that is, the value "0" detected by the comparator 1401 for the first time. In the Golomb code, the number of bits on the left side of the value "0" that has appeared for the first time equals that on the right side. For example, a code "00011" includes the same number of bits on the left and right side of the third "0", i.e., "00" and "11". Hence, the value latched by the latch 1406 represents the number of symbols of the suffix of the Golomb code. Simultaneously, a counter 1407 starts counting symbol data in the cycle of the symbol data, that is, the value "0" detected by the comparator 1401 for the first time. A comparator 1408 compares the count value of the counter 1407 with the number of symbols of the suffix of the Golomb code latched by the latch 1406. If the two input values coincide, that is, in the cycle in which the values of the two signals become equal, the comparator 1408 outputs a signal representing that the symbol data is final symbol data.

An inverse binarization unit 108 executes an inverse operation of binarization processing shown in, for example, FIG. 12. More specifically, the inverse binarization unit 108 converts the symbol data string shown on the right side of FIG. 12 into a symbol shown on the left side.

Figure 9:
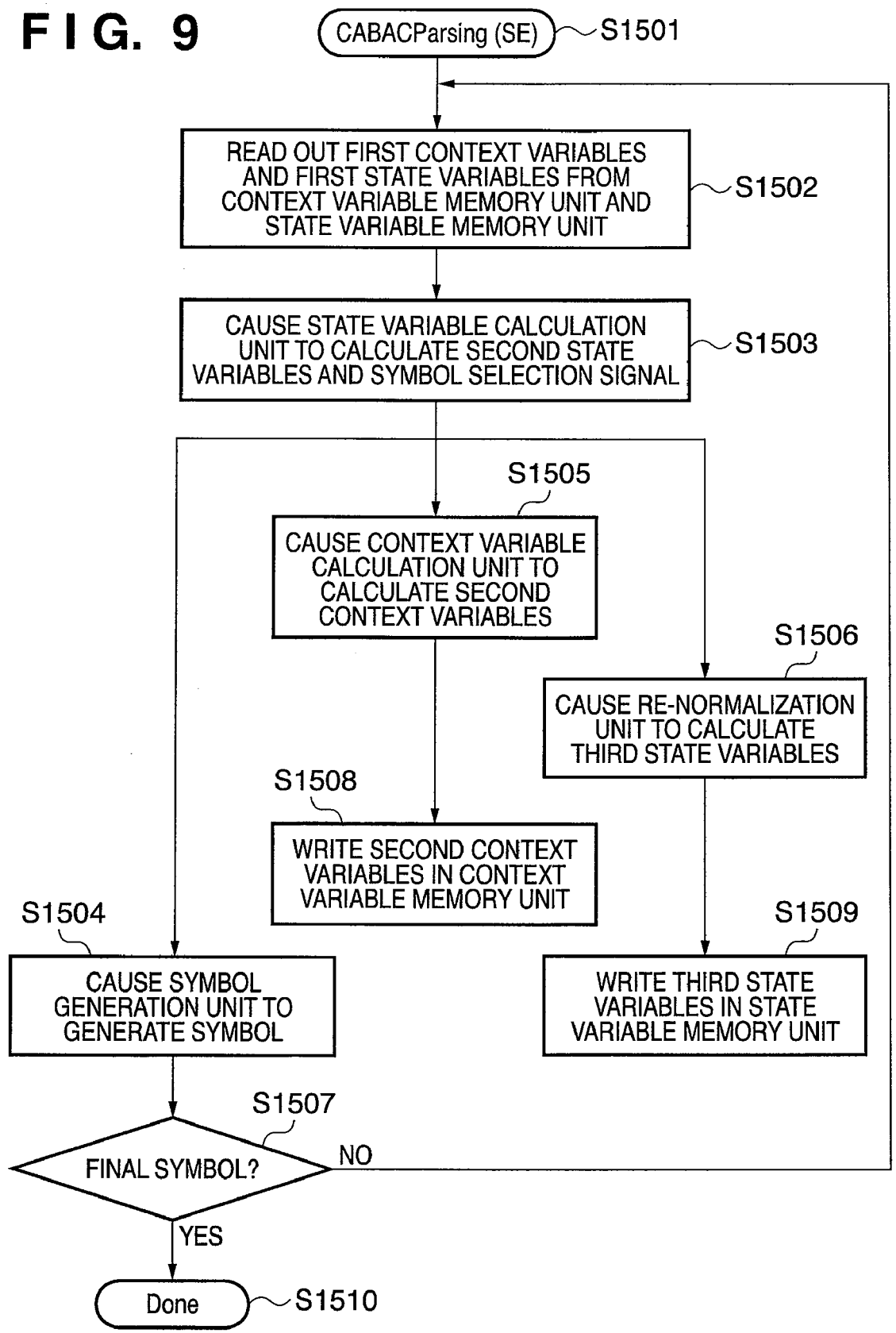
FIG. 9 is a flowchart illustrating the operation of the decoding apparatus according to the embodiment.

The operation of the entropy decoding apparatus according to the embodiment described above will be described in more detail with reference to the flowchart in FIG. 9.

In step S1502, the state variable calculation unit 101 reads out the first context variables and first state variables from the context variable memory unit 103 and state variable memory unit 102. In step S1503, the state variable calculation unit 101 determines the symbol selection signal by using the first context variables and first state variables and calculates second state variables usable for the update and re-normalization processing of the context variables.

In step S1504, the symbol generation unit 104 generates a symbol based on the symbol selection signal and sends it to the final symbol determination unit 107. In step S1507, the final symbol determination unit 107 generates a symbol data string from the symbol received from the symbol generation unit 104 and executes final symbol determination. If the symbol data is not the final symbol, the process returns to step S1502.

In step S1505, the context variable calculation unit 105 calculates second context variables by using the second state variables and symbol selection signal output in step S1504 and the first context variables. In step S1508, the context variable calculation unit 105 writes the second context variables calculated in step S1505 in the context variable memory unit 103. The second context variables written in the context variable memory unit 103 are used as the first context variables when the processing in step S1502 is executed next.

In step S1506, the re-normalization unit 106 calculates the third state variables by using the second state variables and decoding target coded data. In step S1509, the re-normalization unit 106 writes the third state variables calculated in step S1506 in the state variable memory unit 102. The third state variables written in the state variable memory unit 102 are used as the first state variables when the processing in step S1502 is executed next.

As described above, the decoding apparatus of this embodiment decodes received coded data by using state variables representing the state of arithmetic decoding processing and context variables representing the probability state of a symbol. The state variables include codIrange and codIOffset. The context variables include MPS and pStateIdx. The symbol selection signal (MPSorNot) determined by the state variable calculation unit 101 using the state variables and context variables is used in the processing of the succeeding step without waiting for the operations of the context variable calculation unit 105 and re-normalization unit 106. For this reason, the decoding apparatus of this embodiment can increase the processing speed.

According to this embodiment, the context variable calculation unit 105 and re-normalization unit 106 operate in parallel. This speeds up the update processing of state variables and context variables and increases the speed of whole decoding processing.

According to this embodiment, the processing of the symbol generation unit 104 to final symbol determination unit 107, the processing of the context variable calculation unit 105, and the processing of the re-normalization unit 106 are executed in parallel, thereby increasing the speed of whole decoding processing. More specifically, the state variable calculation unit 101 calculates the second state variables before calculation of the symbol selection signal and final state variable (state variable obtained by re-normalization processing) so that symbol generation, context variable generation, and re-normalization are executed in parallel. Since the symbol data necessary for the final symbol determination unit 107 is generated by the logic except the processing of the context variable calculation unit 105 and re-normalization unit 106, high-speed final symbol determination is possible. In addition, since the final symbol determination is executed by using the output of the symbol generation processing, the final symbol determination processing with heavy load can be executed in parallel to context variable generation and re-normalization processing. Hence, the entropy decoding processing can be executed at a high speed. Consequently, it is possible to provide an entropy decoding apparatus using high-speed arithmetic decoding capable of processing one symbol in one cycle.

Other Embodiments

An arithmetic decoding apparatus implemented by hardware has been described above. However, an arithmetic decoding apparatus may be implemented by using software. In this case, the above-described parallel operation is implemented by multithreading (multiprocessor).

The object of the present invention is also achieved by causing a computer (or CPU or MPU) to read out and execute program codes stored in a recording medium which records software program codes to implement the functions of the above-described embodiment. For example, the recording medium is supplied to a system or apparatus, and the computer of the system or apparatus reads out and executes the program codes stored in the recording medium. In this case, the program codes read out from the storage medium implement the functions of the above-described embodiment by themselves, and the storage medium which stores the program codes constitutes the present invention.

Examples of the storage medium usable to supply the program codes are a flexible disk, hard disk, optical disk, magnetooptical disk, CD-ROM, CD-R, magnetic tape, nonvolatile memory card, ROM, and DVD.

The functions of the above-described embodiment are implemented not only when the computer executes the readout program codes but also when the operating system (OS) running on the computer partially or wholly executes actual processing based on the instructions of the program codes.

Alternatively, the program codes read out from the storage medium are written in the memory of a function expansion board inserted into the computer or a function expansion unit connected to the computer. The CPU of the function expansion board or function expansion unit partially or wholly executes actual processing based on the instructions of the program codes, thereby implementing the functions of the above-described embodiment.

As described above, according to the present invention, decoding processing can be executed at a higher speed.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-298210, filed Nov. 1, 2006, which is hereby incorporated by reference herein in its entirety.

What is claimed is:

1. A decoding apparatus for executing arithmetic decoding of input coded data by using a state variable representing a state of arithmetic decoding processing and a context variable representing a probability state of a symbol, comprising:
    a first memory unit which holds a first context variable;
    a second memory unit which holds a first state variable;
    a state variable calculation unit which calculates a second state variable based on the first context variable and the first state variable and determines a selection signal representing a symbol as a result of arithmetic decoding processing;
    a context variable calculation unit which calculates a second context variable based on the first context variable and the selection signal and updates contents of said first memory unit by the second context variable; and
    a re-normalization unit which calculates a third state variable by using the coded data and the second state variable and updates contents of said second memory unit by the third state variable,
    wherein the selection signal determined by said state variable calculation unit is used in processing of a succeeding stage without waiting for operations of said context variable calculation unit and said re-normalization unit.

2. The apparatus according to claim 1, wherein said context variable calculation unit and said re-normalization unit operate in parallel.

3. The apparatus according to claim 1, wherein
    the context variable represents a most probable symbol and a probability state thereof,
    the selection signal represents whether to select the most probable symbol, and
    the apparatus further comprises a generation unit which generates symbol data based on the selection signal and the most probable symbol represented by the first context variable.

4. The apparatus according to claim 1, further comprising a determination unit which determines by using the symbol data whether the symbol data is a final symbol of a syntax element.

5. The apparatus according to claim 4, wherein said context variable calculation unit, said re-normalization unit, and said determination unit operate in parallel.

6. The apparatus according to claim 4, further comprising an inverse binarization unit which executes inverse binarization processing by using the symbol data when said determination unit determines that the symbol data is the final symbol of the syntax element.

7. The apparatus according to claim 4, wherein said determination unit determines whether the symbol data is the final symbol by detecting whether the symbol data has a value "0" (zero).

8. A decoding method of executing arithmetic decoding of input coded data by using a state variable representing a state of arithmetic decoding processing and a context variable representing a probability state of a symbol, comprising:
    the state variable calculating step of calculating a second state variable based on a first context variable held by a first memory unit and a first state variable held by a second memory unit and determining a selection signal representing a symbol as a result of arithmetic decoding processing;
    the context variable calculating step of calculating a second context variable based on the first context variable and the selection signal and updating contents of the first memory unit by the second context variable; and
    the re-normalization step of executing re-normalization to calculate a third state variable by using the coded data and the second state variable and updating contents of the second memory unit by the third state variable,
    wherein the selection signal determined in the state variable calculating step is used in processing of a succeeding stage without waiting for operations of the context variable calculating step and the re-normalization step.

9. The method according to claim 8, wherein the context variable calculating step and the re-normalization step operate in parallel.

10. The method according to claim 8, wherein
    the context variable represents a most probable symbol and a probability state thereof,
    the selection signal represents whether to select the most probable symbol, and
    the method further comprises the generating step of generating symbol data based on the selection signal and the most probable symbol represented by the first context variable.

11. The method according to claim 8, further comprising the determining step of determining by using the symbol data whether the symbol data is a final symbol of a syntax element.

12. The method according to claim 11, wherein the context variable calculating step, the re-normalization step, and the determining step operate in parallel.

13. The method according to claim 11, further comprising the inverse binarizing step of executing inverse binarization processing by using the symbol data when it is determined in the determining step that the symbol data is the final symbol of the syntax element.

14. The method according to claim 11, wherein in the determining step, it is determined whether the symbol data is the final symbol by detecting whether the symbol data has a value "0" (zero).

15. A computer-readable storage medium storing a control program which causes a computer to execute a method of claim 8.

* * * * *